(12) United States Patent
Mayer

(10) Patent No.: US 6,753,204 B1
(45) Date of Patent: Jun. 22, 2004

(54) METHOD FOR ASSEMBLING INTEGRATED CIRCUITS WITH PROTECTION OF THE CIRCUITS AGAINST ELECTROSTATIC DISCHARGE

(75) Inventor: Albrecht Mayer, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/164,123

(22) Filed: Sep. 30, 1998

(30) Foreign Application Priority Data

Sep. 30, 1997 (DE) ......................................... 197 43 344

(51) Int. Cl.⁷ ............................................. H01L 21/48
(52) U.S. Cl. ........................ 438/107; 438/131; 438/108; 438/111; 438/132; 438/467
(58) Field of Search ................................ 438/108, 111, 438/132, 467, 140, 915, 281, 107, 131, FOR 369, FOR 371; 257/E25.109

(56) References Cited

U.S. PATENT DOCUMENTS 4,714,949 A * 12/1987 Simmons et al. ........... 257/355
5,587,598 A * 12/1996 Hatanaka ..................... 257/355
5,682,057 A * 10/1997 Kuriyama .................... 257/529
5,760,478 A * 6/1998 Bozso et al. ................. 257/777
6,054,334 A * 4/2000 Ma .............................. 438/14

FOREIGN PATENT DOCUMENTS

DE         236 623 B5    6/1986
EP         0115143 A2 * 12/1983 .......... H01L/27/02

* cited by examiner

Primary Examiner—George Fourson
Assistant Examiner—Julio J. Maldonado
(74) Attorney, Agent, or Firm—Laurence A. Greenberg; Werner H. Stemer; Gregory L. Maybac

(57) ABSTRACT

A method and a circuit arrangement for protecting integrated circuits against electrostatic discharge (ESD) during and after packaging. An electrical connection between two integrated circuits is made by producing a low-impedance connection in the first integrated circuit, between a signal pad and a pad for a supply potential. The connection has a portion of reduced cross section, which is preferably severed by a current pulse applied after the arrangement has been assembled in a package and the connection has been electrically bonded to the second integrated circuit. The ESD protection during assembly requires no additional chip surface area.

16 Claims, 1 Drawing Sheet

METHOD FOR ASSEMBLING INTEGRATED CIRCUITS WITH PROTECTION OF THE CIRCUITS AGAINST ELECTROSTATIC DISCHARGE

BACKGROUND OF THE INVENTION

Field of the Invention

The invention relates to a method for producing an electrical connection between integrated circuits with protection against electrostatic discharges. The invention also relates to an arrangement of two electrically conductively connected integrated circuits with protection against electrostatic discharges.

In electronic systems, there is a need for providing two or more integrated circuits in one package with a signal connection, to enable a compact arrangement of the circuits. The circuits have contact areas, so-called pads, which are connected via bonding wires to connection pins of the package, known as pins. By way of them, the supply voltage and signals can be supplied. Inside the package, signal transmission among the circuits again takes place via respective connection pads which in turn are joined to one another via bonding wires. In general, these internal signal terminals and connections are not extended outside the package.

To prevent electrostatic discharges that come into contact with the external package pins from destroying the circuits and function units inside the circuit, the pads extended to the outside are assigned protective structures guarding against electrostatic discharge (ESD). These protective structures act as switches, which become conducting when there is overvoltage and dissipate the applied electrostatic discharge to a line for one of the supply voltages. The ESD protection structures occupy a not inconsiderable amount of circuit surface area.

In conventional technology, protection structures are needed for the terminal pads provided for internal signal connections in the package as well, so as to dissipate electrostatic discharges that can occur during assembly, for instance during bonding. These ESD protection structures increase the chip surface area as well.

U.S. Pat. No. 5,587,599 describes a method for producing a semiconductor component with protection against electrostatic discharge. During the production of the wafer, the terminals of the circuit are connected to ground. At the end of wafer production and before the semiconductor chips are tested, the ground connections of the terminals are severed.

In East German Patent Disclosure DD 236 623 B5, a method for hybrid assembly of electronic components is described in which two external terminals of a hybrid circuit are short-circuited to one another via a severable connection. Internally, electrodes of a MOSFET are coupled with these terminals.

SUMMARY OF THE INVENTION

It is accordingly an object of the invention to provide a method for assembling integrated circuits with protection of the circuits against electrostatic discharge, and an arrangement of integrated circuits with protection against electrostatic discharge, which overcomes the above-mentioned disadvantages of the heretofore-known devices and methods of this general type and which obtains electrical connection among integrated circuits that requires less surface area than prior art methods and circuits and still provides adequate protection against electrostatic discharge.

With the foregoing and other objects in view there is provided, in accordance with the invention, a method for producing an electrical connection between integrated circuits, which comprises: providing a first integrated circuit having a terminal, a signal terminal; forming an electrically conductive connection between the terminal and the signal terminal of the first integrated circuit; providing a second integrated circuit having a terminal that is coupled to a protective structure for protecting against electrostatic discharges; disposing the first and second integrated circuits adjacent one another; electrically connecting the signal terminal of the first integrated circuit to the terminal of the second integrated circuit; and severing the electrically conductive connection between the terminal and the signal terminal of the first integrated circuit using an energy pulse.

In accordance with an added feature of the invention, there is provided a method wherein the severing step is performed by applying an electrical current pulse to the terminal of the second integrated circuit.

In accordance with an additional feature of the invention, there is provided a method wherein the forming step includes: forming the electrically conductive connection between the terminal and the signal terminal of the first integrated circuit with a portion of reduced cross sectional area as compared to the rest of the connection; and dimensioning the portion to dissipate electrostatic discharges between the terminal and the signal terminal of the first integrated circuit and to be severed during application of the energy pulse in the severing step.

In accordance with another feature of the invention, there is provided a method wherein the energy pulse used in the severing step is an electrical current pulse applied to the terminal of the second integrated circuit.

In accordance with a further added feature of the invention, there is provided a method including: disposing the first and second integrated circuits in a package having terminal pins so that the signal terminal of the first integrated circuit is not accessible from outside of the package; and connecting the terminal of the first integrated circuit and the terminal of the second integrated circuit to a respective terminal pin of the package.

In accordance with a further additional feature of the invention, there is provided a method wherein the severing step is performed after the step of connecting the respective terminals to the respective terminal pins.

In accordance with still a further feature of the invention, there is provided a method wherein the disposing step is performed so that terminal of the second integrated circuit is not covered by the first integrated circuit.

In accordance with yet another feature of the invention, there is provided a method for producing an electrical connection between integrated circuits, which comprises: providing a first integrated circuit having a surface; disposing first and second terminal pads on the surface of the first integrated circuit; forming an electrically conductive connection between the first and second terminal pads of the first integrated circuit; providing a second integrated circuit having a surface; disposing first and second terminal pads on the surface of the second integrated circuit; electrically coupling at least the first terminal pad of the second integrated circuit to a protective structure for protecting against electrostatic discharges; disposing the surfaces of the first and second integrated circuits longitudinally adjacent one another so that the first and second terminal pads of the second integrated circuit are not covered by the first integrated circuit; electrically joining at least one of the first and second terminal pads of the first integrated circuit to one of the first and second terminal pads of the second integrated circuit; forming an electrically conductive connection between the first and second terminal pads of the first integrated circuit; and severing the electrically conductive connection using an energy pulse.

In accordance with yet another added feature of the invention, there is provided a method wherein the electrically joining step is performed using an electrically conductive solderable material.

In accordance with yet another additional feature of the invention, there is provided a method wherein the electrically joining step is performed using a conductive adhesive material.

In accordance with yet a further feature of the invention, there is provided a method including electrically joining the other one of the first and second terminal pads of the first integrated circuit to the other one of the first and second terminal pads of the second integrated circuit.

In accordance with again an added feature of the invention, there is provided an arrangement of electrically connected integrated circuits, comprising: a first integrated circuit including a terminal, a signal terminal, and an connection electrically connecting the terminal and the signal terminal, the connection including a main portion having a cross sectional area, and the connection including a constricted portion having a reduced cross sectional area with respect to the cross sectional area of the main portion; and a second integrated circuit including a terminal having a protective structure for protecting against electrostatic discharge, and a connection electrically connecting the terminal of the second integrated circuit to the signal terminal of the first integrated circuit.

In accordance with again an additional feature of the invention, there is provided an arrangement wherein the constricted portion is dimensioned to conduct electrostatic charges and dimensioned for severance when subjected to an energy pulse.

In accordance with again another feature of the invention, there is provided an arrangement wherein: the first integrated circuit includes at least one further signal terminal; and the connection electrically connecting the terminal of the second integrated circuit to the signal terminal of the first integrated circuit includes a diode, and the connection electrically connecting the terminal of the second integrated circuit to the signal terminal of the first integrated circuit includes a further diode electrically connecting the at least one further signal terminal to the terminal of the second integrated circuit.

Preferably, the connection between the signal terminal and the supply potential terminal in one of the circuits is a metal or polysilicon conductor track. It therefore assures a low-impedance connection between these terminals. During assembly, any electrostatic discharges that occur can be dissipated thereby. After assembly, when the signal terminal is no longer accessible from outside, the connection is unnecessary; it is severed and has no further influence on signal processing. The metal conductor track is preferably formed in the uppermost metal layer, which is optionally applied in addition to the other metal layers that connect the parts of the integrated circuit that perform signal processing. A major advantage is that no additional surface area is needed.

Other features which are considered as characteristic for the invention are set forth in the appended claims.

Although the invention is illustrated and described herein as embodied in a method for assembling integrated circuits with protection of the circuits against electrostatic discharge, and an arrangement of integrated circuits with protection against electrostatic discharge, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
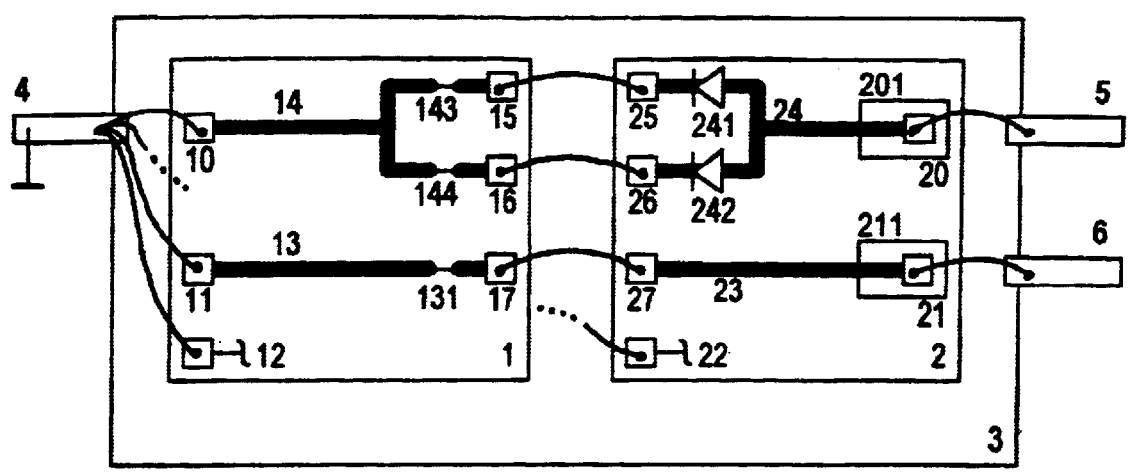
FIG. 1 shows a plan view of two integrated circuits in a first preferred embodiment, disposed side by side in a package with the structures for ESD protection.

The arrangement shown in FIG. 1 includes a first integrated circuit 1 and a second integrated circuit 2. Both circuits are disposed in a package 3, of which only the lower part is shown. The integrated circuit 1 includes function units (not shown), such as transistor circuits, to which signals to be processed are supplied in operation via the terminals 15, 16, 17. For ESD protection during assembly of the integrated circuits in the package, conductor tracks 13, 14 are also provided, which connect each of the signal terminals 15, 16 and 17 to a respective terminal 10 or 11, which is connected to one of the supply potentials of the circuit, such as ground. These terminals 15, 16, 17, 10, 11, are so-called pads, which are generally flat regions at which the integrated circuit is contacted from outside. The terminals 10, 11 are conventionally present anyway and moreover are needed for the typical voltage supply of the circuit 1. The lines 13, 14 for instance comprise metal conductor tracks. They are disposed in a metallizing plane in addition to the metal conductor tracks already provided for the wiring of the transistor circuits. This metallizing plane is expediently the uppermost aetallizing plane. It can optionally be applied in addition to the metallizing planes provided for the other wiring. Alternatively, the lines 13, 14 may be made of polysilicon. In that case, they are expediently located in deeper wiring layers. The conductor tracks include a short portion with a constriction 143, 144, 131. These places, compared with the remaining course of the conductor tracks, have a substantially smaller cross section. The terminal pads 10, 11 are connected via conventional bonding wires to a package pin 4 for ground. A terminal pad 12 that supplies grounding to the signal processing circuits is also connected to the pin 4 via a bonding wire.

Terminal pads 25, 26, 27 are provided in the integrated circuit 2 and each one is connected via a respective bonding wire to the pads 15, 16 and 17 of the circuit chip 1. One terminal pad 22 is also bonded to the ground pin 4, to connect circuits in the chip 2 to ground. The pads 25, 26 are connected via a line 24 to a pad 20, which in turn is bonded to an external terminal pin 5 of the package. The pad 27 is connected via a line 23 to another pad 21, which is bonded to a further package pin 6. For decoupling the pads 25, 26 from one another, two diodes 241, 242 are provided, by way of which the line 24 is—carried to the pads 25 and 26, respectively. The package pins 5, 6—as described in greater detail below—are intended to supply a current pulse and are dimensioned so as to interrupt or sever the constrictions 143, 144, 131 after assembly. Since the terminals 20, 21 have contact outside the package even after assembly, they are assigned conventional ESD protection structures 201, 211. Each of these protection structures contains an arrangement of dopant regions which responds upon application of an overvoltage, such as 2000–3000 V, and connects the applicable terminal in low-impedance fashion to one of the supply potentials.

The ESD protection of the terminals 15, 16, 17 by the conductor tracks 14, 13 during assembly of the integrated circuits 1, 2 in the package 3 is assured as follows. In the assembly robot, the integrated circuits 1, 2 are first mounted on a pad frame and then connected to one another and to the package pins by bonding wires. During this phase, because of possible electrostatic discharge from the bonding tools and the bonding wires, the terminals 15, 16, 17 are threatened with ESD. Any ESDs are dissipated to the ground terminals 10 and 11 via the low-impedance connections 13, 14. All the ground terminals of the circuit are also electrically connected to one another internally. Once the package has been closed and the ESD-vulnerable terminals 15, 16, 17 can no longer be touched, the constrictions 143, 144, 131 are severed. This is done by a sufficiently long and forceful current pulse, which is adjusted such that the constrictions evaporate and the lines 13, 14 at those places are interrupted. The constrictions are equivalent to a fuse. The current pulse is impressed from outside via the terminal pins 5, 6 and carried onward via the various terminals and lines of the circuit chip 2. During normal functional use of the circuit 1, signals to be processed are supplied to the appropriate pads 15, 16, 17 by function units in the circuit chip 2 via the pads 25, 26, 27. The constrictions 143, 144, 131 are expediently located as close as possible to the signal pads 15, 16, 17, so that the latter are burdened as little as possible by parasitic capacitances.

The pad 27 is connected directly via the conductor track 23 to the pad 21 and the associated ESD protection structure 211. The constriction 131 can therefore be severed once the bonding of the pads 17, 27 has already been completed but still before the complete closure of the package, when external contact of the pads 17 that has the risk of ESD is still possible, because the pad 17 is by then already connected conductively with the ESD protection structure 211 via the bonding wire to the pad 27. Since in this case the package is still open, severing the constriction 131 can also be done using other provisions that produce energy pulses, such as a laser beam. The terminal pin 6 for the current pulse can then be omitted. In a further feature of the invention, the pads 25, 26 and optionally the pad 27 as well may also be provided with an ESD protection structure corresponding to the structures 201, 211. In that case, once bonding with the circuit chip 1 has been completed, the pads 15, 16, 17 are connected to the respective ESD protection structures directly via the bonding wires. The current pulse pins 5, 6 can be omitted, and the constrictions can be severed by suitable current impression into the pads 15, 16, 17 with the package open, or by a laser pulse.

The cross sections of the constrictions 143, 144, 131 have an area of approximately 0.4 to 1.0 $\mu m^2$. At the lower end of this range, an ESD strength of approximately 250 to 350 V exists, which is adequate for the assembly. The constriction can be melted through by a current of approximately 12 mA. The remainder of the conductor track has a cross-sectional area that is greater by one order of magnitude.

Figure 2:
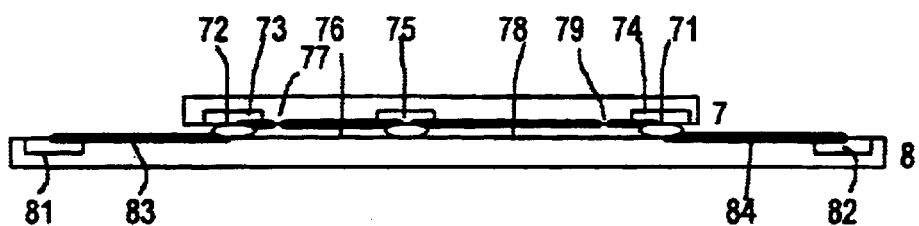
FIG. 2 shows a cross section through a second preferred embodiment of an arrangement of two integrated circuits.

The method and the arrangement are especially advantageous in the example shown in FIG. 2. A first circuit chip 7 and a second circuit chip 8 are in contact with one another on their respective surface toward which the active elements point and where consequently the corresponding terminal pads are also accessible. The electrical contact, which in the version of FIG. 1 is made by means of bonding wires, is made in the version of FIG. 2 by means of contact nipples 71, 72. Alternatively, a connection can be made with conductive adhesive material. This technique relies on what is known as the flip-chip connecting technique. By it, the terminal pad 73 in chip 7 is connected, via the solder nipple 72 and the connecting line 83, to the terminal pad 81 in the chip 8. In a corresponding way, the pad 74 is connected to the pad 82 via the solder nipple 71 and the line 84. Even if the chips 7, 8 are spaced apart slightly by the solder nipples 71, 72, it is not possible by mechanical means to gain access to the pads 73, 74. As soon as the chips 7, 8 have been placed spatially relative to one another in the way shown, the pads 73, 74 are no longer at risk from ESD. The connection 76 between the signal pad 73 and the ground pad 74 is therefore subsequently severed at the constriction 77 by current imposition at the pad 81. In a corresponding way, the connection 78 between the pads 74, 75 is severed at the point 79.

The described method and arrangement can be used especially advantageously if the circuit chip 1 or 7 is a conventionally mass-produced microcontroller which is put into contact with a chip 2 or 8 that contains additional circuit means so that the complete arrangement of chips forms an in-circuit-emulation (ICE) arrangement of the microcontroller. The terminal pads 15, 16, 17 and 73, 74 of the respective microcontroller 1 or 7 are additional terminal pads, beyond those provided in the mass-production version, by way of which internal signals are carried to the outside via the respective chip 2 or 8. These pads are formed with ESD protection in the additional metal layer in which the conductor tracks 13, 14 or 76, 78 respectively, are also formed. The circuit units that are connected to the additional pads are effectively ESD-protected during assembly.

I claim:

1. A method for producing an electrical connection between integrated circuit chips, which comprises:

providing a first integrated circuit chip having a terminal and a signal terminal;

forming an electrically conductive connection between the terminal and the signal terminal of the first integrated circuit chip;

providing a protective structure that becomes conductive to dissipate electrostatic discharges;

providing a second integrated circuit chip having a terminal that is coupled to the protective structure;

disposing the first integrated circuit chip and the second integrated circuit chip adjacent one another;

electrically connecting the signal terminal of the first integrated circuit to the terminal of the second integrated circuit chip;

connecting the terminal of the first integrated circuit chip to a terminal of a package; and subsequent to connecting the terminal of the first integrated circuit chip to the terminal of the package, severing the electrically conductive connection between the terminal and the signal terminal of the first integrated circuit chip using an energy pulse.

2. The method according to claim 1, wherein the severing step is performed by intentionally applying an electrical current pulse to the terminal of the second integrated circuit chip.

3. The method according to claim 1, wherein the forming step includes:

forming the electrically conductive connection with a portion of reduced cross sectional area as compared to the rest of the connection; and dimensioning the portion to dissipate electrostatic discharges between the terminal and the signal terminal of the first integrated circuit chip and to be severed during application of the energy pulse in the severing step.

4. The method according to claim 3, wherein the energy pulse used in the severing step is an electrical current pulse applied to the terminal of the second integrated circuit chip.

5. The method according to claim 1, including:

disposing the first integrated circuit chip and the second integrated circuit chip in a package having terminal pins so that the signal terminal of the first integrated circuit chip is not accessible from outside of the package; and connecting the terminal of the first integrated circuit chip and the terminal of the second integrated circuit chip to a respective terminal pin of the package.

6. The method according to claim 5, wherein the severing step is performed after the step of connecting the respective terminals to the respective terminal pins.

7. The method according to claim 1, wherein the disposing step is performed so that terminal of the second integrated circuit chip is not covered by the first integrated circuit chip.

8. The method according to claim 1, which comprises providing the energy pulse in the form of a current which is intentionally applied to the electrically conductive connection.

9. The method according to claim 1, which comprises providing the energy pulse in the form of a laser beam which is applied to the electrically conductive connection.

10. The method according to claim 1, which comprises performing the severing step before packaging the first integrated circuit chip and the second integrated circuit chip.

11. The method according to claim 1, wherein the first integrated circuit includes at least one transistor.

12. A method for producing an electrical connection between integrated circuit chips, which comprises:

providing a first integrated circuit chip having a surface;

disposing first and second terminal pads on the surface of the first integrated circuit chip;

forming an electrically conductive connection between the first and second terminal pads of the first integrated circuit chip;

providing a second integrated circuit chip having a surface;

disposing first and second terminal pads on the surface of the second integrated circuit chip;

providing a protective structure acting as a switch that becomes conductive when there is an overvoltage to dissipate an electrostatic discharge to a line for a supply voltage;

electrically coupling at least the first terminal pad of the second integrated circuit chip to the protective structure;

disposing the surfaces of the first integrated circuit chip and the second integrated circuit chip longitudinally adjacent one another so that the first and second terminal pads of the second integrated circuit chip are not covered by the first integrated circuit chip;

electrically joining at least one of the first and second terminal pads of the first integrated circuit chip to one of the first and second terminal pads of the second integrated circuit chip;

severing the electrically conductive connection using an energy pulse.

13. The method according to claim 12, wherein the electrically joining step is performed using an electrically conductive solderable material.

14. The method according to claim 12, wherein the electrically joining step is performed using a conductive adhesive material.

15. The method according to claim 12, including electrically joining the other one of the first and second terminal pads of the first integrated circuit chip to the other one of the first and second terminal pads of the second integrated circuit chip.

16. The method according to claim 12, wherein the first integrated circuit includes at least one transistor.

* * * * *